(12) United States Patent
Adekore et al.

(10) Patent No.: US 8,772,829 B2
(45) Date of Patent: Jul. 8, 2014

(54) ZINC-OXIDE BASED EPITAXIAL LAYERS AND DEVICES

(75) Inventors: Bunmi T. Adekore, Arlington, MA (US); Jonathan Pierce, Somerset, NJ (US)

(73) Assignee: Key Trans Investments, LLC, Dover, DE (US)

( * ) Notice: Subject to any disclaimer, the term of this patent is extended or adjusted under 35 U.S.C. 154(b) by 888 days.

(21) Appl. No.: 12/951,308

(22) Filed: Nov. 22, 2010

(65) Prior Publication Data
US 2011/0062440 A1 Mar. 17, 2011

Related U.S. Application Data

(63) Continuation of application No. PCT/US2009/044646, filed on May 20, 2009.

(60) Provisional application No. 61/054,842, filed on May 21, 2008, provisional application No. 61/060,754, filed on Jun. 11, 2008.

(51) Int. Cl.
*H01L 31/102* (2006.01)

(52) U.S. Cl.
USPC .......................................................... 257/189

(58) Field of Classification Search
CPC ........................ H01L 21/365; H01L 33/0087
USPC ................. 257/43, 94, 189; 438/416
See application file for complete search history.

(56) References Cited

U.S. PATENT DOCUMENTS

| | | | |
|---|---|---|---|
| 6,045,626 A * | 4/2000 | Yano et al. | 148/33.4 |
| 6,475,825 B2 | 11/2002 | White et al. | |
| 2003/0064541 A1 | 4/2003 | Kadota et al. | |
| 2004/0108513 A1 | 6/2004 | Narukawa et al. | |
| 2005/0012107 A1 | 1/2005 | Shei et al. | |
| 2005/0224825 A1* | 10/2005 | Ishizaki | 257/94 |
| 2006/0124943 A1 | 6/2006 | Li et al. | |
| 2006/0131599 A1 | 6/2006 | Slater et al. | |
| 2006/0233969 A1 | 10/2006 | White et al. | |
| 2007/0126021 A1 | 6/2007 | Ryu et al. | |
| 2007/0218703 A1 | 9/2007 | Kaeding et al. | |
| 2009/0269879 A1 | 10/2009 | Adekore et al. | |

FOREIGN PATENT DOCUMENTS

| | | |
|---|---|---|
| EP | 1 928/ 032 | 6/2008 |
| JP | 2001072498 A * | 3/2001 |
| JP | 2003-533006 | 11/2003 |
| JP | 2005-298867 | 10/2005 |
| JP | 2007-088271 | 4/2007 |
| JP | 2007-129271 | 5/2007 |
| WO | WO-2006/119927 | 11/2006 |
| WO | WO-2007/034864 | 3/2007 |
| WO | WO-2008/050479 | 5/2008 |
| WO | WO-2008/073469 | 6/2008 |

OTHER PUBLICATIONS

Machine English translation of JP 2001-072498 A.*
Office Action on JP Application 2011-510675, mailed Jan. 22, 2013 (English translation not available).

(Continued)

*Primary Examiner* — Brook Kebede (57) ABSTRACT

Methods of forming planar zinc-oxide based epitaxial layers, associated heterostructures, and devices are provided.

28 Claims, 7 Drawing Sheets

(56) References Cited

OTHER PUBLICATIONS

Communication issued on EP Application 09751454.1, mailed Jul. 8, 2011.
International Preliminary Report on Patentability for PCT/US2009/044650, issued Nov. 23, 2010.
International Preliminary Report on Patentability for PCT/US2009/046845, issued Dec. 14, 2010.
International Preliminary Report on Patentability on PCT/US2009/044646, issued Nov. 23, 2010.
International Search Report and Written Opinion for PCT/US2009/044650, mailed Jul. 31, 2009.
International Search Report and Written Opinion for PCT/US2009/046845, mailed Nov. 12, 2009.
International Search Report and Written Opinion on PCT/US2009/044646, mailed Sep. 25, 2009.
Jeong S H et al., "Physical properties and etching characteristics of metal (Al, Ag, Li) doped ZnO films grown by RF magnetron sputtering," Thin Solid Films, vol. 516, No. 19, Nov. 21, 2007, pp. 6598-6603.
Kim et al., "Characterization of Ag doped -type ZnO films," Proceedings of the SPIE, vol. 6474, Feb. 20, 2007, pp. 647409/1-647409/4.
Shin et al., "Effect of doping elements on ZnO etching characteristics with CH4/H2/Ar plasma," Thin Solid Films, vol. 515, No. 12, Nov. 17, 2006, pp. 4950-4954.
Wang et al., "Luminescence and Raman scattering properties of Ag-doped ZnO films," Journal of Physics D. Applied Physics, vol. 39, No. 23, Dec. 7, 2006, pp. 4992-4996.

* cited by examiner

ZINC-OXIDE BASED EPITAXIAL LAYERS AND DEVICES

CROSS-REFERENCE TO RELATED APPLICATIONS

This patent application is a continuation of International Application No. PCT/US2009/044646 filed May 20, 2009, which claims priority to U.S. Provisional Patent Application No. 61/054,842 filed May 21, 2008, entitled ZINC-OXIDE BASED EPITAXIAL LAYERS AND DEVICES, and U.S. Provisional Patent Application No. 61/060,754 filed Jun. 11, 2008, entitled ZINC OXIDE ALLOYS AND DEVICES INCLUDING THE SAME, the disclosures of which are incorporated by reference herein in their entirety.

TECHNICAL FIELD

The invention generally relates to epitaxial layers, and devices including such layers, formed of semiconductors having a wurtzite crystal structure and, more particularly, the invention relates to growth of planar zinc-oxide based epitaxial layers.

BACKGROUND ART

Chemical vapor deposition (CVD) is a deposition process that is used to form thin films on a substrate, such as a wafer. In a CVD process, a substrate is exposed to one or more precursors in a reaction chamber. The substrate is typically heated to a temperature higher than the decomposition temperature of the precursor so that when the precursor contacts the substrate it reacts with or decomposes onto the surface of the substrate to produce the desired thin film. However, the crystallographic structure of some substrates may affect the growth of the film, producing non-planar, three-dimensional films due to preferential growth rates along different crystallographic axes. For example, in hexagonal wurtzite materials, such as zinc oxide (ZnO), gallium nitride (GaN), and related materials, growth along the two dominant axes, the c-axis and a-axis, varies primarily due to the anisotropy in growth rates along these two axes. Some techniques have been developed to enable single crystalline and contiguous growth on the c-axis. See, e.g., PCT publication WO 2008/073469 (PCT application serial number PCT/US2007/025432, filed Dec. 11, 2007) entitled "Zinc Oxide Multi-Junction Photovoltaic Cells and Optoelectronic Devices," commonly owned by the assignee and incorporated by reference herein. Nevertheless, planar deposition of ZnO and ZnO based alloys on substrates with hexagonal crystallographic structures remains a challenge.

SUMMARY OF EMBODIMENTS

In accordance with one embodiment of the invention, a method of growing a zinc-oxide based epitaxial layer includes providing an m-plane or vicinal m-plane wurtzite substrate, and forming a zinc-oxide based epitaxial layer on the substrate using metalorganic chemical vapor deposition.

In accordance with related embodiments of the invention, the method may include heating the substrate between about 400° C. to about 900° C. The substrate may include a zinc-oxide based substrate. The metalorganic chemical vapor deposition supersaturation ratio of Group VI elements to Group II elements may be less than 8000. The zinc-oxide based epitaxial layer may further include gold, silver and/or potassium. The substrate may be a vicinal substrate having an off-cut angle from the m-plane ranging from about 2 degrees to about 15 degrees. The substrate may be heated between about 550° C. to about 650° C. Embodiments may include a device having an epitaxial layer produced according to the method.

In accordance with another embodiment of the invention, a method of growing a zinc-oxide based epitaxial layer includes providing a vicinal wurtzite substrate having an off-cut angle from a principal plane ranging from about 2 degrees to about 15 degrees, heating the substrate, and forming a zinc-oxide based epitaxial layer on the substrate. The zinc-oxide based epitaxial layer may further include gold, silver and/or potassium. In accordance with related embodiments, the zinc-oxide based epitaxial layer may be formed using metalorganic chemical vapor deposition. The substrate may be a c-plane vicinal wurtzite substrate and may be heated between about 600° C. to about 1000° C., preferably between about 800° C. to about 950° C. The substrate may be an m-plane vicinal wurtzite substrate and may be heated between about 480° C. to about 900° C., preferably between about 550° C. to about 650° C. Embodiments may include a device having an epitaxial layer produced according to the method.

In accordance with another embodiment of the invention, a method of growing a zinc-oxide based epitaxial layer includes providing an a-plane or vicinal a-plane wurtzite substrate, heating the substrate between about 400° C. to about 900° C., and forming a zinc-oxide based epitaxial layer, that further includes gold, silver and/or potassium, on the substrate. In accordance with related embodiments, the zinc-oxide based epitaxial layer may be formed using metalorganic chemical vapor deposition. The substrate may be a vicinal wurtzite substrate having an off-cut angle from the a-plane ranging from about 2 degrees to about 15 degrees. The substrate may be heated between about 550° C. to about 650° C. Embodiments may include a device having an epitaxial layer produced according to the method.

In accordance with another embodiment of the invention, a device includes a zinc-oxide based epitaxial layer oriented along a non-polar (e.g., m-plane or a-plane) or vicinal non-polar plane of the zinc-oxide based epitaxial layer. The zinc-oxide based epitaxial layer may further include gold, silver and/or potassium. In accordance with another embodiment of the invention, a device includes a zinc-oxide based epitaxial layer oriented along a vicinal plane having an off-cut angle from a principal plane ranging from about 2 degrees to about 15 degrees, wherein the zinc-oxide based layer further comprises at least one element selected from the group consisting of gold, silver and potassium. In related embodiments, the device may include a light-emitting device and/or an LED exhibiting low droop during operation.

In accordance with another embodiment of the invention, a method of growing a zinc-oxide based epitaxial layer includes providing a vicinal c-plane substrate having an off-cut angle from a principal plane ranging from about 2 degrees to about 15 degrees, heating the substrate, and forming a zinc-oxide based layer on the substrate.

In accordance with another embodiment of the invention, a method of growing a zinc-oxide based epitaxial layer includes providing a semi-polar wurtzite substrate and forming a zinc-oxide based epitaxial layer on the substrate using metalorganic chemical vapor deposition. The method may include heating the substrate between about 400° C. to about 900° C. The substrate may include a zinc-oxide based substrate. The metalorganic chemical vapor deposition supersaturation ratio of Group VI elements to Group II elements may be less than 8000. The zinc-oxide based epitaxial layer may further include gold, silver and/or potassium. The substrate may have a deposition surface parallel or substantially parallel to a plane belonging to the {11-22} or {10-12} plane families. The method may include heating the substrate between about 550° C. to about 650° C. Embodiments may include a device having an epitaxial layer produced according to the method.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

Various embodiments provided herein describe methods of growing planar zinc-oxide based epitaxial layers using metalorganic chemical vapor deposition (MOCVD). As used herein, a planar layer refers to a layer that is contiguous. A planar layer may have any surface morphology, for example, the planar layer may have a smooth or textured surface. Epitaxial layers described herein may be monocrystalline and may have a low defect density, such as a dislocation density less than about $10^7$ cm$^{-2}$ (e.g., less than about $10^6$ cm$^{-2}$, less than about $10^5$ cm$^{-2}$) and/or a stacking fault density less than about $10^4$ cm$^{-1}$ (e.g., less than about $10^3$ cm$^{-1}$, less than about $10^2$ cm$^{-1}$).

MOCVD is a CVD process which uses metalorganic precursors. Some embodiments described herein provide substrate configurations and growth processes that allow planar zinc-oxide based epitaxial layers to be grown on the substrates using MOCVD. Details of illustrative embodiments are discussed below. Unlike molecular beam epitaxy (MBE) which is a physical deposition process, MOCVD is a chemical deposition process that involves pyrolysis of source gases. Thus, for MOCVD, the temperature of the growth process controls both the pyrolysis of source gases and surface kinetics of the deposition process. As such, deposition of materials readily achieved using MBE, are not necessarily easily transferred to MOCVD. MOCVD processes described herein enable the deposition of planar zinc-oxide based epitaxial layers in a variety of non-c-plane wurtzite substrates.

Figure 1:
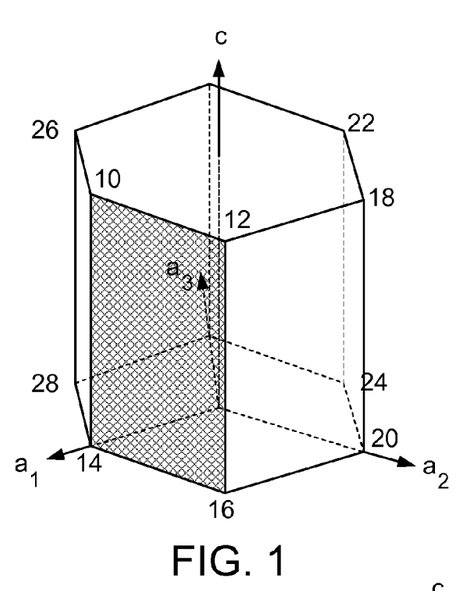
FIG. 1 schematically shows a hexagonal crystal structure with an m-plane highlighted.
Figure 2:
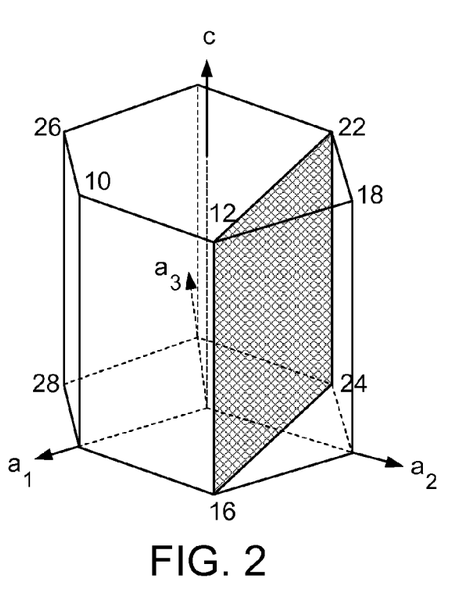
FIG. 2 schematically shows a hexagonal crystal structure with an a-plane highlighted.
Figure 3:
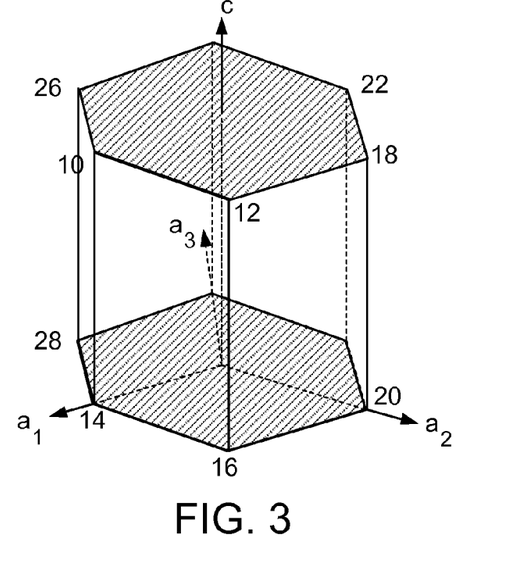
FIG. 3 schematically shows a hexagonal crystal structure with c-planes highlighted.

As shown in FIGS. 1, 2, and 3, hexagonal wurtzite materials, such as ZnO and Group III-nitrides (e.g., GaN, AN, InN), have a hexagonal crystal structure with crystallographic directions shown as $a_1$, $a_2$, $a_3$ and c. As known by those skilled in the art, some of the crystallographic planes in the hexagonal structure are the m-plane (10-10) shown shaded in FIG. 1, the a-plane (11-20) shown shaded in FIG. 2, and the +c-plane (0001) or the -c-plane (000-1) shown shaded in FIG. 3, which is perpendicular to the c-axis, e.g., the +c-plane is the plane defined by the numerals 10, 12, 18, 22, and 26. For wurtzite crystal materials, such as ZnO-based semiconductors and Group III-nitride semiconductors, the m-planes and a-planes are non-polar planes, and the c-planes are polar planes.

Although specific planes are highlighted in FIGS. 1 and 2, one skilled in the art will recognize that the m-plane family may be any of the six sides of the hexagonal structure and the a-plane family may be any of the three planes perpendicular to one of the three a-axes. For example, the m-plane may be the plane defined by the numerals 12, 16, 18, and 20 rather than the plane defined by numerals 10, 12, 14, and 16 (shaded plane) as shown in FIG. 1. Similarly, the a-plane may be the plane defined by the numerals 12, 16, 26, and 28 rather than the plane defined by the numerals 12, 16, 22, and 24 (shaded plane) shown in FIG. 2.

Figure 4A:
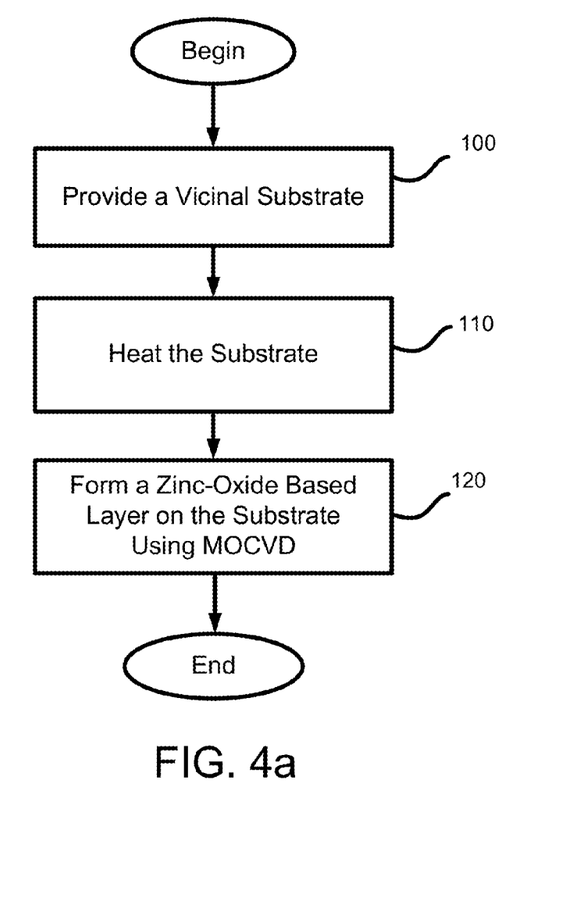
FIGS. 4a-b show processes for depositing planar zinc-oxide based epitaxial layers using metalorganic chemical vapor deposition according to embodiments of the present invention.
Figure 5:
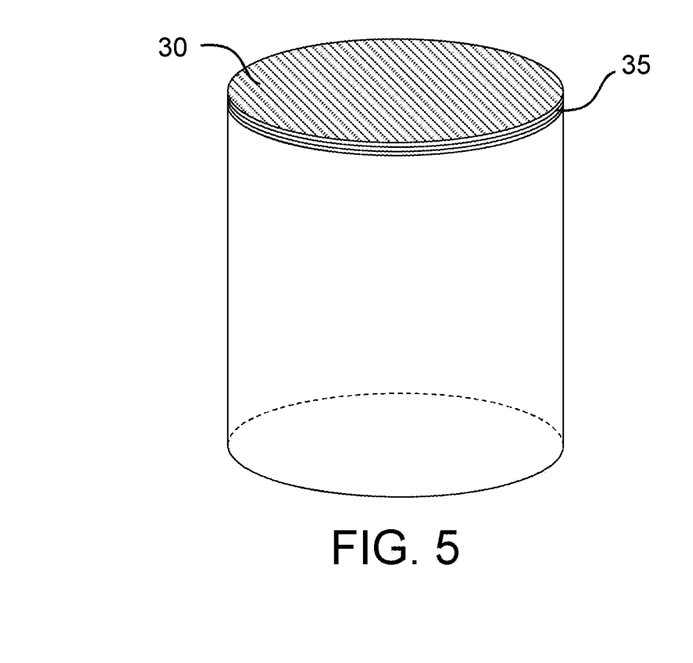
FIG. 5 schematically shows a crystal boule.
Figure 6:
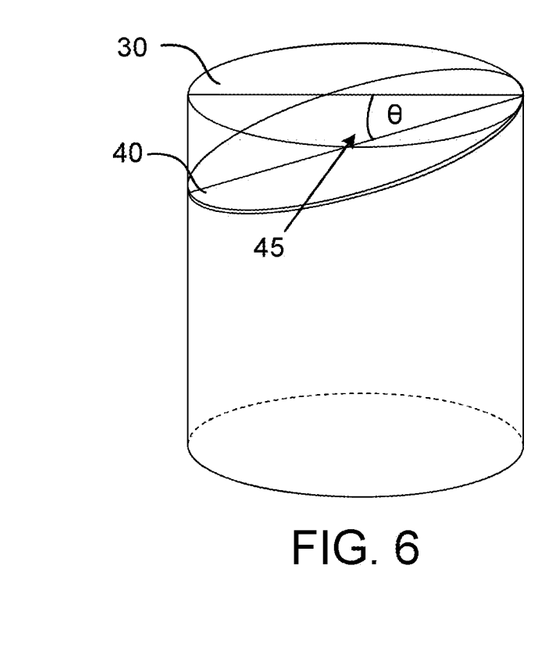
FIG. 6 schematically shows a crystal boule with an off-cut angle 45, in order to produce a vicinal substrate from the boule according to embodiments of the present invention.

Referring to FIG. 4a, a process for depositing planar zinc oxide based epitaxial layers using MOCVD is described according to one embodiment of the present invention. The process begins at step 100, in which one or more vicinal substrates are provided. As known by those skilled in the art, a vicinal substrate may be formed by having the substrate's surface offset from a principal crystallographic plane, such as a c-plane, m-plane or a-plane of a wurtzite crystal. For example, FIG. 5 schematically shows a crystal boule with a surface 30, such as the m-plane of an hexagonal crystal. In this example, on-axis m-plane substrates are then prepared by slicing the crystal into thin sections 35 with both of its surfaces parallel to the surface 30. Continuing with this example, as schematically shown in FIG. 6, m-plane vicinal substrates may be prepared by slicing the thin sections at an offset angle from the on-axis m-plane surface 30, such that the surface 40 of the substrates and the m-plane surface 30 form an off-cut angle 45. As known by those skilled in the art, the off-cut angle 45 may be formed in any direction with respect to the designated plane. For example, referring to FIG. 1, the vicinal substrate surface may be offset from the m-plane toward the +c-plane (e.g., the side of the plane formed with numerals 10, 12 may move toward the center of the hexagon), the -c-plane (e.g., the side of the plane formed with numerals 14, 16 may move toward the center of the hexagon), an a-plane (e.g., the side of the plane formed with indices 12, 16 may move toward the center of the hexagon or toward the a-plane defined by the numerals 10, 14, 18, and 20), etc. In some embodiments, the off-cut angle 45 may range from about 2 degrees to about 25 degrees. In some other embodiments, the off-cut angle 45 may range from 2 degrees to about 15 degrees. In some embodiments, the off-cut angle 45 may range from about 0.5 degrees to about 25 degrees. In other embodiments, the off-cut angle 45 may range from 0.5 degrees to about 15 degrees. After cutting, the substrate surface may be polished via chemical mechanical polishing (CMP).

In some embodiments, the substrate may be formed of a ZnO-based semiconductor (e.g., ZnO, ZnMgO, ZnCdO, or combinations thereof) or related materials. In some embodiments, the substrate may be electrically conductive. In other embodiments, the substrate may be insulating or semi-insulating. The electrically conductive or semi-insulating nature of the substrate may be achieved via substrate doping with appropriate dopant atoms.

Referring to FIG. 4a, the one or more vicinal substrates may be heated in a reactor chamber in step 110. The temperature range utilized for the growth process on the vicinal substrate may vary depending on the crystallographic direction of the substrate's surface. For example, for m-plane or a-plane vicinal substrates, the temperature range of the substrate may be from about 400° C. to about 900° C., preferably from 480° C. to about 900° C., more preferably from about 550° C. to about 650° C., and most preferably around 600° C. In some embodiments, the temperature of the substrate may be less than about 500° C. and greater than about 400° C. In c-plane vicinal substrates, the temperature range of the substrate may be from about 600° C. to about 1000° C., preferably from about 800° C. to about 950° C., and more preferably around 900° C.

Referring to FIG. 4a, in step 120, a zinc-oxide based epitaxial layer may be formed on the substrate using MOCVD. As known by those skilled in the art, the zinc-oxide based epitaxial layer may be formed by providing a first gas comprising zinc from a zinc-based source and a second gas comprising oxygen from an oxygen-based source. The zinc-based source and the oxygen-based source are typically supplied in the gas phase, although the source may be in a solid, liquid, or semisolid phase. The first gas and second gas are transported to the one or more substrates in the reactor chamber. Control of the process gas composition may be accomplished using mass-flow controllers, valves, etc., as known by those skilled in the art. The pressure of the growth ambient may be held in a range from about 20 Torr to about 76 Torr. By varying the reaction gases and/or their flow rates, one or more semiconductor layers (e.g., monocrystalline semiconductor layers) having desired compositions may be deposited on the substrate. Controlling the reaction can be used to control the thickness of each semiconductor layer. Reaction gases may include diethylzinc or dimethylzinc for Zn, and oxygen gas ($O_2$), carbon dioxide, nitrous oxide, or nitrogen dioxde for O, although others may be used. Other reaction gases may be included to incorporate alloying elements into the zinc-oxide based epitaxial layer, such as cyclopentadiethylmagnesium for Mg, diethylcadmium for Cd, di-tertiary-butylselenium for Se, and other reaction gases known to those of ordinary skill in the art. Other reaction gases that may be included may include ethyl chloride as an n-type dopant gas of Cl, trimethyls or triethyls of Al, Ga and In as n-type dopant gases, nitrogen gas ($N_2$) or ammonia as a p-type dopant gas of N, diethylphosphite as a p-type dopant gas of P, arsine as a p-type dopant gas of As, trimethylantimony as a p-type dopant gas of Sb, or any other suitable dopant reaction gases.

In some embodiments, dopants may include p-type dopants such as gold, silver and/or potassium, and the source of the dopant may be supplied in a solid, liquid, semisolid, or gas phase. In some embodiments, at least two dopants (e.g., p-dopants) may be incorporated into the epitaxial layer, for example at least two p-dopants from the group consisting of gold, silver and potassium may be incorporated into the epitaxial layer. When the source has a condensed matter form (e.g., solid, liquid, or semisolid phase), the source may be converted to the gas phase by heating the source to above room temperature as described in U.S. patent application Ser. No. 12/421,133 filed Apr. 9, 2009, entitled "Metalorganic Chemical Vapor Deposition of Zinc Oxide," commonly owned by the assignee and herein incorporated by reference in its entirety. The dopant source may include, preferably, non-halogenated and non-silylated complexes or may include halogenated or silylated complexes.

Preferably, there is a larger percentage of Group VI elements, such as oxygen, than Group II elements, such as zinc, in the reactor chamber so that a planar ZnO-based epitaxial layer may be grown. Thus, in some embodiments, the supersaturation ratio of Group VI elements, such as oxygen, to the Group II elements, such as zinc, in the reactor chamber may be less than about 8000, preferably between about 50 to about 8000, and more preferably between about 650 to about 8000. As known by those skilled in the art, the supersaturation ratio may be derived from the molarity, the vapor pressure, or the flow rate of the gases. The deposition process may occur when pyrolysis of the precursor complexes occurs either in the gas mixture or at the surface of the substrate when the gas mixture contacts the heated substrate surface, and the zinc-oxide based epitaxial layer is formed on the substrate.

In some embodiments, one or more additional gases may also be used with the first and second gases, e.g., other organometallic precursors, reactive gases, inert carrier gases, etc. For example, dopants may be added during the MOCVD growth process (e.g., having concentrations of about $10^{15}$ to about $10^{21}$ cm$^{-3}$ (or more) in the epitaxial layer) so that the dopant is incorporated into the ZnO-based epitaxial layer, thereby allowing for the formation of n-type or p-type ZnO-based epitaxial layers.

Figure 4B:
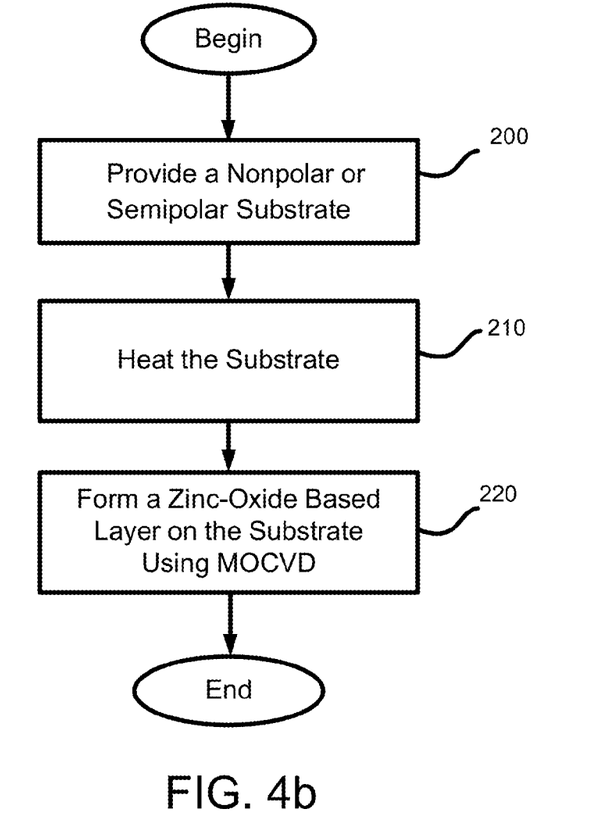
Figure 7:
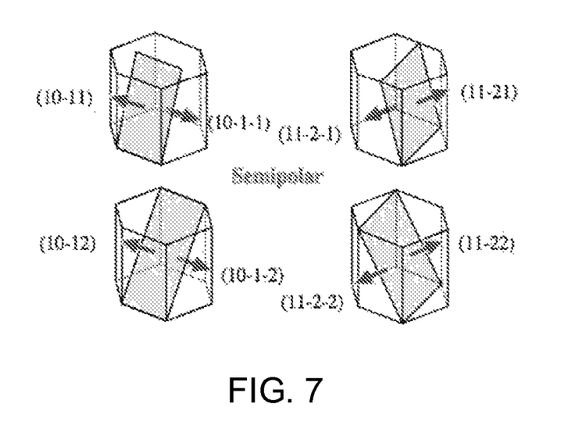
FIG. 7 schematically shows a hexagonal crystal structure with semi-polar planes highlighted.

Referring to FIG. 4b, a process for depositing planar zinc-oxide based epitaxial layers using MOCVD is described according to other embodiments. The process begins at step 200, in which a non-polar or semi-polar wurtzite substrate, for example, an m-plane (10-10) substrate, a-plane (11-20) substrate, or semi-polar substrate is provided. FIG. 7 schematically illustrates a hexagonal wurtzite crystal structure with some semi-polar crystal planes highlighted. Examples of semi-polar crystal planes may include (10-11), (10-1-1), (10-12), (10-1-2), (11-2-1), (11-21), (11-2-2), and (11-22) planes. In some embodiments, a semi-polar substrate may be provided (e.g., by cutting a crystal at an appropriate angle with respect to the principal crystal planes and then polishing the substrate surface). Thus, a semi-polar substrate has a deposition surface parallel or substantially parallel to a semi-polar plane, such as a plane belonging to the {11-22} or {10-12} plane families. Similarly, a non-polar substrate may have a deposition surface parallel or substantially parallel to a plane belonging to the m-plane {10-10} families or a-plane {11-20} families.

Referring to FIG. 4b, the non-polar or semi-polar substrate may be heated in a reactor chamber in step 210. In this instance, the substrate may be heated to between about 400° C. to about 900° C., preferably from about 480° C. to about 900° C., more preferably from about 550° C. to about 650° C., and most preferably around 600° C. In some embodiments, the temperature of the substrate may be less than about 500° C. and greater than about 400° C. Semi-polar substrates making an angle with respect to the c-plane of less than about 45 degrees may be heated from about 600° C. to about 1000° C., preferably from about 800° C. to about 950° C., and more preferably around 900° C.

Referring to FIG. 4b, in step 220, a zinc-oxide based epitaxial layer may be formed on the substrate using MOCVD. The supersaturation ratio of the Group VI elements (e.g., oxygen) to the Group II elements (e.g., zinc) may be less than about 8000, preferably between about 50 to about 8000, and more preferably between about 650 to about 8000. As previously described, a p-type dopant, such as gold, silver and/or potassium, may be used along with the Group II elements (e.g., zinc) and Group VI elements (e.g., oxygen) in order to form the zinc-oxide based epitaxial layer on the substrate using MOCVD, thereby allowing for the formation of p-type ZnO-based epitaxial layers. In some embodiments, at least two dopants (e.g., p-dopants) may be incorporated into the epitaxial layer, for example at least two p-dopants from the group consisting of gold, silver and potassium may be incorporated into the epitaxial layer.

Various MOCVD reactor configurations may be used to deposit the epitaxial layers described herein, although the process parameters used herein may vary with other reactor configurations as known to those skilled in the art. The presently disclosed process parameters are applicable for a vertical CVD reactor.

In some embodiments, the zinc-oxide based epitaxial layers may be oxides containing zinc. Specific examples may be zinc oxide, oxides of Group IIA elements with zinc, oxides of Group IIB elements with zinc, or oxides of Group IIA and Group IIB elements with zinc. In some embodiments, the zinc-oxide based epitaxial layer may include a Group VIA element, such as S, Se and/or Te. In some embodiments, the zinc-oxide based epitaxial layer may include ZnO, ZnMgO, ZnCaO, ZnBeO, ZnSrO, ZnBaO, ZnCdO, ZnSeO, ZnTeO, ZnSO, ZnMgCdO, ZnCdSeO, ZnCdTeO or combinations thereof, where alloying elements may be incorporated in any desired proportions (e.g., up to solubility limits). Epilayer structures including one or more of such epitaxial layers may be formed via growth techniques described herein. Epilayer structures may include heterostructures, such as double heterostructures, that may include one or more quantum wells.

Various embodiments may include semiconductor devices, as described in detail below, such as opto-electronic devices, electronic devices, or photonic devices, formed with one or more of the zinc-oxide based epitaxial layers. In some embodiments, a semiconductor device may include one or more zinc-oxide based epitaxial layers oriented along a non-polar or semi-polar plane of the zinc-oxide based epitaxial layer. In some embodiments, a semiconductor device may include one or more zinc-oxide based epitaxial layers oriented along an m-plane or a vicinal m-plane. In some embodiments, a semiconductor device may include one or more zinc-oxide based epitaxial layers oriented along an a-plane or a vicinal a-plane. In some embodiments, a semiconductor device may include one or more zinc-oxide based epitaxial layers oriented along a vicinal plane off-cut (e.g., having an off-cut angle from about 2 degrees to about 15 degrees) from a principal plane of the zinc-oxide based epitaxial layer.

In some embodiments, an opto-electronic device may include a light-emitting device such as a light-emitting diode (LED) or a laser diode. Such a light-emitting device may include one or more zinc-oxide based epitaxial layers oriented along a non-polar plane (e.g., m-plane or a-plane) or vicinal planes thereof, or along a semi-polar plane or vicinal planes thereof. Such a light-emitting device may exhibit low efficiency droop operation wherein the wall-plug efficiency remains substantially constant as electrical current density increases. For example, the efficiency of a zinc-oxide based LED grown on a non-polar substrate (or vicinal substrates thereof) may be substantially similar at about 0.5 A/mm$^2$ and at least about 1 A/mm$^2$ (e.g., at least about 2 A/mm$^2$, at least about 4 A/mm$^2$).

Figure 8:
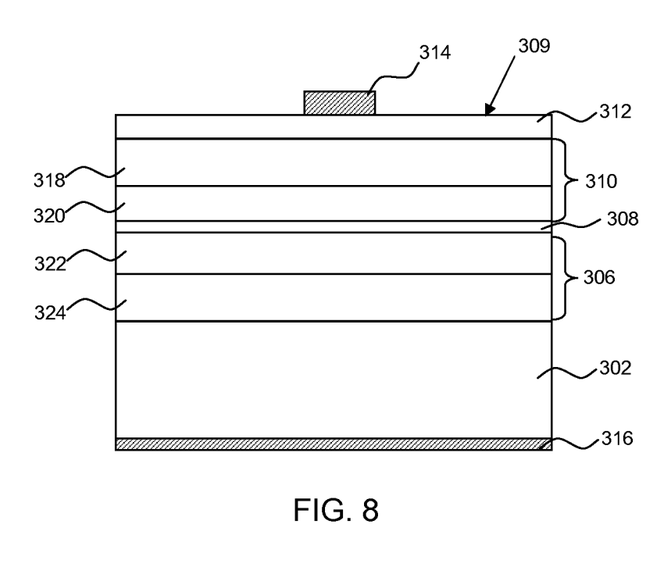
FIG. 8 is a cross-sectional view of a semiconductor device, such as a light-emitting device, including one or more epitaxial semiconductor layers formed of a wurtzite semiconductor and forming a non-zero angle with a c-plane of the wurtzite semiconductor according to embodiments of the present invention.

FIG. 8 is a cross-sectional view of a semiconductor device, such as a light-emitting device, including one or more epitaxial semiconductor layers. Although the following is described in the context of a light-emitting device, it should be appreciated that such a structure or similar structures may also be used in other semiconductor devices such as other opto-electronic, photonic, or electronic devices (e.g., photodiodes, photovoltaics, excitonic devices, excitonic integrated circuits, excitonic light switches, transistors). The one or more epitaxial semiconductor layers of the device may be formed of a wurtzite semiconductor, such as one or more ZnO-based semiconductor(s). The one or more epitaxial semiconductor layers may be oriented parallel to a crystal plane forming a non-zero angle (e.g., greater than about 2 degrees) with a c-plane of the wurtzite semiconductor, for example parallel or substantially parallel to a non-polar plane, a semi-polar plane, or a vicinal principal plane, as previously described above.

The semiconductor device may include a structure comprising a plurality of semiconductor layers and an active layer 308 disposed between the plurality of semiconductor layers. Active layer 308 may be oriented parallel to a crystal plane forming a non-zero angle with a c-plane of the wurtzite semiconductor, for example parallel or substantially parallel to a non-polar plane or a semi-polar plane, as previously described above. The plurality of semiconductor layers may comprise a first conductivity-type semiconductor layer 306 (e.g., n-type or p-type) and a second conductivity-type semiconductor layer 310 (e.g., p-type or n-type) having an opposite conductivity type than semiconductor layer 306, and the active layer 308 may be disposed between semiconductor layer 306 and semiconductor layer 310. In some embodiments, semiconductor layer 306 may comprise a first conductivity-type (e.g., n-type or p-type) clad layer 322 and a first conductivity-type contact layer 324. Contact layer 324 may have a different (e.g., higher) doping concentration than the clad layer 322, and may be formed of the same or different semiconductor materials. Semiconductor layer 310 may comprise a second conductivity-type (e.g., p-type or n-type) clad layer 320 and a second conductivity-type contact layer 318. Contact layer 318 may have a different (e.g., higher) doping concentration than the clad layer 320, and may be formed of the same or different semiconductor materials.

One or more of semiconductor layer 306, semiconductor layer 310, and active layer 308 may be formed of ZnO-based materials, such as one or more ZnO-based epitaxial layers. Such materials may include ZnO and/or ZnO-based alloys including Mg, Ca, Be, Sr, Ba, Cd, Se, Te, and/or S. Such alloys are described in PCT publication WO 2008/073469, filed Dec. 11, 2007 entitled "Zinc Oxide Multi-Junction Photovoltaic Cells and Optoelectronic Devices," commonly owned by the assignee and herein incorporated by reference in its entirety.

Active layer 308 may include one or more layers having a different bandgap than the adjacent semiconductor layers, thereby forming a double heterostructure. Semiconductor layer 306 and semiconductor layer 310 may provide carrier confinement due to bandgap differences with the active layer. For example, the bandgap of at least some layers (e.g., cladding and/or contact layers) forming semiconductor layers 306 and 310 may be larger than the bandgap of one or more layers in the active layer 308 (e.g., quantum wells and/or barrier layers). Such a configuration may ensure that layers 306 and 310 do not substantially absorb light emitted by active layer 308. In some embodiments, active layer 308 includes one or more well layers formed of ZnO-based materials, such as ZnO, ZnMgO, ZnCdO, ZnSeO, ZnTeO, and/or combinations thereof. For a double heterostructure device, part or all of semiconductor layers 306 and/or 310 may be formed of ZnO-based semiconductors, such as ZnO, ZnMgO, ZnCdO, ZnSeO, and/or ZnTeO, having a larger bandgap than the well layer(s) of active layer 308.

Active layer 308 may be a bulk layer, a single quantum well structure, or a multiple quantum well structure that may include barrier layers between the quantum wells. In some embodiments, the thickness of active layer 308 may range from about 1 nm to about 500 nm, and preferably between about 5 nm and about 50 nm, and more preferably greater than about 10 nm and less than about 30 nm (e.g., about 15 nm).

In some embodiments, the semiconductor portion of the device forms a double heterostructure and active layer 308 is a well layer having a thickness greater than about 3 nm (e.g., greater than about 5 nm, greater than about 10 nm, greater than about 15 nm). For a light-emitting device, such as an LED, having well layers parallel or substantially parallel to a non-polar or semi-polar crystal plane, such a thick well layer, enables a high efficiency and a minimal efficiency decrease as a function of increasing current density (i.e., "low efficiency droop"), which may be due to low built-in polarization fields and/or low Auger recombination. Furthermore, since active layer 308 of the devices described herein may have low defect densities (e.g., dislocation densities less than about $10^6$ cm$^{-2}$, less than about $10^5$ cm$^{-2}$, less than about $10^4$ cm$^{-2}$, less than about $10^3$ cm$^{-2}$), light-emitting device efficiency can be further enhanced, which may be due to a low defect-mediated non-radiative recombination rate.

Active layer 308 may be at least in part intrinsic, n-doped and/or p-doped. For example, active layer 308 may comprise one or more quantum wells and barrier layers disposed on either side of each quantum well. Some or all of these layers may be intrinsic layers. For example, the quantum wells and/or the barrier layers may be intrinsic layers. Alternatively, the barrier layers and/or the quantum wells may be doped (e.g., n-doped and/or p-doped).

Semiconductor layer 306 may be an n-type layer and semiconductor layer 310 may be a p-type layer. In such a device, substrate 302 may be an n-type substrate. Alternatively, semiconductor layer 306 may be a p-type layer and semiconductor layer 310 may be an n-type layer. In such a device, substrate 302 may be a p-type substrate. The thickness of semiconductor layer 306 and/or semiconductor layer 310 may range from about 0.1 µm to about 3 µm, however any other suitable thickness may also be used.

Doping of semiconductor layer 306 and/or semiconductor layer 310 may be achieved with various suitable dopant elements for the semiconductor material. For example, for ZnO-based semiconductors, doping with one or more suitable Group I (e.g., IA and/or IB) and/or Group V elements, such as K, Au, Ag, N, P As, Sb and/or other appropriate elements, may be used to achieve p-type conductivity. Doping with one or more suitable Group III elements (e.g., B, Al, Ga and/or In) and/or Group VII elements (e.g., F, Cl, Br, I) may be used to achieve n-type conductivity. The doping concentration of part or all of semiconductor layer 306 and/or semiconductor layer 310 may range between from about $10^{15}$ cm$^{-3}$ to about $10^{21}$ cm$^{-3}$, preferably about $10^{17}$ cm$^{-3}$ to about $10^{20}$ cm$^{-3}$ (e.g., about $10^{19}$ cm$^{-3}$) however any other suitable doping concentration may also be used.

The plurality of semiconductor layers (e.g., layers 306 and 310) and/or the active layer 308 may have a hexagonal crystal structure (e.g., a wurtzite crystal structure), examples of which may include ZnO-based semiconductors. The plurality of semiconductor layers (e.g., layers 306 and 310) and the active layer 308 may be epitaxially deposited on a substrate 302 that may also have a hexagonal crystal structure (e.g., a wurtzite crystal structure). In some devices, substrate 302 may also have an hexagonal crystal structure (e.g., a wurtzite crystal structure). Deposition processes that may form such structures have been described above. In some embodiments, the plurality of semiconductor layers (e.g., layers 306 and 310) and active layer 308 form interfaces that are oriented parallel or substantially parallel to a non-polar plane (e.g., m-plane or a-plane) or a semi-polar plane of the semiconductor forming the active layer.

Substrate 302 may be a ZnO-based substrate (e.g., ZnO, ZnMgO, ZnCdO, or combinations thereof) or any other suitable substrate. In some embodiments, the substrate may be a single crystal substrate. The substrate may be electrically conductive (e.g., n-type or p-type) and/or transparent (e.g., to the wavelength of light emitted by the active layer).

In some embodiments, active layer 308, the n-type semiconductor layer and/or the semiconductor p-type layer (e.g., semiconductor layers 306 and 310) may be monocrystalline layers having a dislocation density of less than about $10^6$ cm$^{-2}$ (e.g., less than about $10^5$ cm$^{-2}$, less than about $10^4$ cm$^{-2}$, less than about $10^3$ cm$^{-2}$, less than about $10^2$ cm$^{-2}$), for example, as measured using etch pit density methods. Such a low dislocation density may be achievable as a result of the deposition of epitaxial layers having a composition that may be substantially lattice-matched to the substrate. The epitaxial layers may have a lattice mismatch with the substrate deposition surface of less than about 2.5% (e.g., less than about 2%, less than about 1%, less than about 0.5%, less than about 0.25%). For example, ZnO-based epitaxial layers, such as ZnO and/or ZnO-based alloys including Mg, Ca, Be, Sr, Ba, Cd, Se, Te, and/or S with a suitable atomic fraction, may be deposited on a ZnO-based substrate (e.g., ZnO, ZnMgO, ZnCdO, or combinations thereof) so as to achieve a low lattice mismatch with the substrate. Single crystal ZnO-based substrates may have a dislocation density of less than about $10^2$ cm$^{-2}$, for example, as measured using etch pit density methods, thereby providing a low dislocation density baseline.

In some embodiments, a transparent conductive layer 312 may be disposed on semiconductor layer 310. Transparent conductive layer 312 may extend over the entire surface of semiconductor layer 310 or over a portion (e.g., a majority) of semiconductor layer 310. Electrode 314 may be disposed on transparent conductive layer 312. Transparent conductive layer 312 may be disposed adjacent semiconductor layer 310 (e.g., the n-type semiconductor or the p-type semiconductor) and may thus provide current spreading from electrode 314 to semiconductor layer 310. Electrode 314 may be formed of any suitable metal that may provide electrical contact with transparent conductive layer 312. Electrode 314 may serve as an Ohmic electrical contact to the adjacent semiconductor. Examples of electrode metals or metal stacks may include Ti/Au, Ti/Al, Ti/Al/Au, Ti/Al/Pt/Au, Cr/Au, Cr/Al, Cr/Al/Au, Al/Au, Al, Al/Pt, In, Ru or the like to form an n-type contact, and Ni/Al/Au, Ni/Ti/Au or the like to form a p-type contact. Part or all of electrode 314 may serve as an electrical contact pad (e.g., bond pad), to which a wire bond or a package metal trace may be attached (e.g., via solder or bump bonding) to provide an external electrical connection.

Transparent conductive layer 312 may be formed of one or more materials (e.g., ZnO-based materials) having a bandgap larger than the bandgap of the active layer or larger than the bandgap of well(s) in the active layer, thereby minimizing the absorption of generated light. In some embodiments, transparent conductive layer 312 may be formed of a transparent conductive oxide. Examples of transparent conductive oxides may include ZnO-based materials, indium oxide, indium tin oxide (ITO), or any combination thereof. In one embodiment, transparent conductive layer 312 includes a ZnO-based material including In, Ga, and/or Al. Transparent conductive layer 312 may have any suitable thickness, with a typical thickness ranging from between about 0.1 μm and about 3 μm, and a preferred thickness of about 0.5 μm.

In some embodiments, a top surface 309 of the device (e.g., top surface of transparent conductive layer 312) may have a textured surface so as to facilitate light extraction. The textured surface may have a root-mean-square (RMS) roughness of greater than about 30 nm (e.g., greater than about 50 nm, greater than about 100 nm). In some embodiments, the textured surface may have a RMS roughness of greater than about 30 nm (e.g., greater than about 50 nm, greater than about 100 nm) and less than about 2 μm (e.g., less than about 1 μm, less than about 500 nm). A textured top surface may be formed during and/or after deposition of the layer, as described in U.S. patent application No. 61/098,097 filed Sep. 18, 2008, entitled "Textured Semiconductor Light-emitting Devices," commonly owned by the assignee and herein incorporated by reference in its entirety. Texturing a layer during deposition may involve the use of appropriate deposition conditions, such as temperature, so as to produce a textured layer during the deposition process. For non-polar (e.g., m-plane, a-plane, or vicinal planes thereof) or semi-polar ZnO-based semiconductors, a textured surface morphology for the deposited layer may be achieved with substrate temperatures ranging from about 400° C. to about 600° C. A CVD process (e.g., MOCVD) may be used to deposit the textured layer. Supersaturation ratios of Group VI to Group II elements (VI/II) in the reaction chamber, such as oxygen to zinc (O/Zn) in the case of ZnO deposition, may range from about 50 to about 5000. Reactant chemistry may play an important role in determining the surface morphology of a deposited layer. For example, when utilizing an $O_2$, $NO_2$, or $N_2O$ oxygen source gas with VI/II supersaturation ratios ranging from about 200 to about 400, the deposited ZnO-based layer exhibited a highly textured surface morphology.

Texturing a layer after deposition may involve roughening (e.g., via one or more wet and/or dry etches) and/or patterning (e.g., via a lithography process) the deposited layer. For ZnO-based semiconductors, a texturing etch may include HCl, a mixture of HCl and $H_3PO_4$, acetic acid, or mixtures thereof. In some embodiments, dilute HCl (e.g., HCl concentrations between about 0.1% and about 1% HCl in deionized water) may be used as a texturing etch. When using dilute HCl, etch times may range from about 5 seconds to about 2 minutes. Preferably, for a dilute HCl etch having an HCl concentration of about 0.5%, etch times may range from about 20 seconds to about 60 seconds. Addition of $H_3PO_4$ to the etch solution may provide increased surface texturing (e.g., increased peak-to-valley depth, increased RMS roughness). The textured surface morphology may include features (e.g., hexagonal features) such as pyramids and/or cones, where the features may have shapes at least partially determined by the crystal structure of the material (e.g., hexagonal crystal).

A first electrode 314 may be disposed on transparent conductive layer 312. A second electrode 316 may be formed on the backside of substrate 302, for embodiments where the substrate is electrically conductive (e.g., n-type or p-type) and thereby may serve as a conductive path to semiconductor layer 306. Electrode 316 may be formed of one or more metals and may provide an electrical contact to substrate 302. Additionally, electrode 316 may also serve as a reflective layer that may reflect light emitted by active layer 308 that impinges on electrode 316. In some embodiments, the backside of substrate 302 may be textured (e.g., roughened and/or patterned) prior to the formation of electrode 316 on the substrate backside, thereby allowing for the formation of a textured reflective layer.

Electrode 316 may serve as an Ohmic electrical contact to the adjacent semiconductor. Electrode 316 may include one or more reflective metal layers, such as a layer of Ag and/or Al, that may be in direct contact with the substrate backside, and one or more electrical contacting metal layer(s) that may be disposed on the reflective metal layer. The electrical contacting metal layer(s) may be formed of any suitable metal(s), such as Ti/Au or the like for an n-type ZnO-based substrate.

During operation of a light-emitting device, electrical current may be injected to active layer 308 via electrodes 314 and 316. Electrons and holes may recombine radiatively at active layer 308 thereby generating light. Light generated in active layer 308 may be extracted via top surface 309 and/or sidewalls of the semiconductor portion of the device. The backside reflective layer that may form part of electrode 316 may reflect light impinging thereon.

The device of FIG. 8 may be fabricated by depositing semiconductor layers 306, 308, 310, and optionally also layer 312 on substrate 302. The deposition process may include MOCVD processes as previously described. In a preferred embodiment, layers 306, 308, 310 and optionally also layer 312 are deposited in a single deposition process. Alternatively, when present, transparent conductor layer 312 may be deposited separately in another deposition system after the deposition of semiconductor layers 306, 308 and 310. In some embodiments, the deposition processes used to form semiconductor layers 306, 308, 310, and optionally also layer 312 on substrate 302 may be those described previously for the growth of non-c-plane (e.g., non-polar planes, semi-polar planes) epitaxial layers.

ZnO-based epitaxial layers that form the device may be deposited as described previously above, and may be p-doped, n-doped, or undoped, to form p-type, n-type, or undoped semiconductor layers, respectively. U.S. patent application Ser. No. 11/551,058 filed Oct. 19, 2006, entitled "Zinc Oxide Based II-VI Compound Semiconductor Layers with Shallow Acceptor Conductivities and Methods of Forming Same," which is hereby incorporated in its entirety by reference, discloses chemical vapor deposition fabrication techniques that enable the use of ZnO compounds in various applications. The fabrication techniques overcome difficulties relating to reliably fabricating p-type ZnO materials with sufficiently high concentrations of relatively shallow acceptor impurities operating as p-type dopants.

In some embodiments, a condensed matter source may be used for some doping elements (e.g., Ag, Au, K) and/or alloying elements to circumvent limited availability of some volatile species using conventional metalorganic transport temperatures and equipment. When using such a condensed matter source, the source can be converted to a gas prior to transport, as described in U.S. patent application Ser. No. 12/421,133 filed Apr. 9, 2009, entitled "Metalorganic Chemical Vapor Deposition of Zinc Oxide," commonly owned by the assignee and herein incorporated by reference in its entirety.

Once the semiconductor layers of the device have been deposited, fabrication of the semiconductor device may continue. Metal layer(s) that may form electrode 316 may be deposited (e.g., evaporated and/or sputtered) on the backside of substrate 302. Metal layer(s) that may form electrode 314 may be deposited (e.g., evaporated and/or sputtered) on a patterned mask disposed on transparent conductive layer 312 and that exposes a portion of the device surface. A lift-off process may be used to form the electrode by selectively removing the mask. For example, a selective etch that etches the mask may be used to remove the mask and form electrode 314 covering a desired portion of the transparent conductive layer 312. Electrode 314 may cover an area of about 50 µm² to about 400 µm², with a preferred area being about 100×100 µm². A wafer including multiple die regions may be diced so as to form the die shown in the cross-section of FIG. 8. Any desirable die size may be chosen, for example, die (top surface) sizes may range from about 100×100 µm² to about 2×2 mm², however other sizes are possible.

Various modifications to the above processes and device structure are possible. For example, substrate 302 may be thinned, for example by using wafer backside grinding, and optionally polished, for example via CMP, so as to reduce the thickness of the substrate (e.g., to a final thickness of less than about 150 µm, preferably about 100 µm) prior to deposition of the electrode on the substrate backside. A reduced substrate thickness may minimize series resistance and/or substrate free carrier light absorption when using an electrically conductive substrate.

Other variations are possible, such as any modification to the contacting geometry, for example modifications to the contacting geometry when using an electrically semi-insulating or insulating substrate. For example, instead of using a vertical electrical contacting geometry, such as that shown in the device of FIG. 8, a lateral electrical contacting geometry may be utilized. In contrast to a vertical electrical contacting geometry where an n-electrode and a p-electrode may be disposed on opposing sides of the device active layer, a lateral electrical contacting geometry may include a first electrode (e.g., n-electrode or p-electrode) disposed over the device active layer and a second electrode of opposing polarity (e.g., p-electrode or n-electrode) disposed in a region where the active layer is absent.

Figure 9:
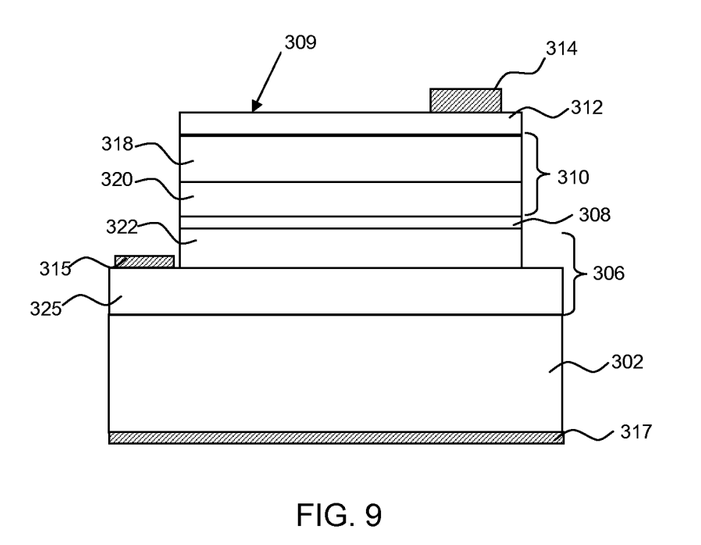
FIG. 9 is a cross-sectional view of a semiconductor device, such as a light-emitting device, having a lateral electrical contacting geometry according to embodiments of the present invention.

FIG. 9 is a cross-sectional view of a semiconductor device, such as a light-emitting device, having a lateral electrical contacting geometry. The device is similar to that of FIG. 8 except that the backside substrate electrode is absent and electrical contact to first conductivity-type contact layer 325 is achieved via electrode 315 that may be in direct contact with contact layer 325. For such an electrical contacting geometry, substrate 302 may be semi-insulating or insulating. Such a configuration may be flip-chip bonded onto a package sub-mount and electrical contact to electrodes 314 and 315 may be achieved via bump bonding or any other suitable contacting approach. For a flip-chip bonded configuration, the backside of substrate 302 may serve as a light emission surface, and thus may be textured to enhance light extraction.

The semiconductor device of FIG. 9 may be formed using epitaxial layer deposition processes (e.g., MOCVD) and micro-fabrication techniques. For example, after depositing epitaxial device layers on substrate 302, as previously described, the device of FIG. 9 may be fabricated by performing a masked etch (e.g., dry etching and/or wet etching) of the semiconductor surface so as to expose contact layer 325 in a portion of each die (i.e., chip) on the substrate. The etch mask utilized may be a photo-resist mask. Electrode 315 may be formed using metal deposition and a liftoff process, similar to processes that may be used to form electrode 314, as described above. A reflective layer 317, such as a metal layer (e.g., Ag, Al), may be formed on the backside of substrate 302, however, this layer need not necessarily serve as an electrode layer since the substrate may be electrically insulating. Alternatively or additionally, a distributed Bragg reflector (DBR), which may be formed of a plurality of oxide-based layers (e.g., metal oxide layers such as ZnO-based layers), may be disposed between active layer 308 and the substrate 302. For flip-chip configurations, reflective layer 317 may be absent and the backside of substrate 302 may serve as a light emission surface.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a zinc-oxide based epitaxial layer, the method comprising:
providing a vicinal wurtzite substrate, wherein the vicinal wurtzite substrate includes an off-cut slice of a hexagonal crystal, and wherein the off-cut slice is offset from a principal crystallographic plane of the hexagonal crystal; and
forming a zinc-oxide based epitaxial layer on the vicinal wurtzite substrate using metalorganic chemical vapor deposition.

2. The method of claim 1, wherein said forming the zinc-oxide based epitaxial layer on the vicinal wurtzite substrate comprises heating the vicinal wurtzite substrate to a temperature between about 400 degrees Celsius and about 900 degrees Celsius.

3. The method of claim 2, wherein said heating the vicinal wurtzite substrate comprises heating the vicinal wurtzite substrate to a temperature between about 550 degrees Celsius and about 650 degrees Celsius.

4. The method of claim 1, wherein the vicinal wurtzite substrate is a zinc-oxide based substrate.

5. The method of claim 1, wherein the metalorganic chemical vapor deposition supersaturation ratio of Group VI elements to Group II elements is less than 8000.

6. The method of claim 1, wherein the zinc-oxide based epitaxial layer further comprises at least one element selected from the group consisting of gold, silver, and potassium.

7. The method of claim 1, wherein the vicinal wurtzite substrate has an off-cut angle from the m-plane ranging from about 2 degrees to about 15 degrees.

8. The method of claim 1, wherein the vicinal wurtzite substrate comprises an m-plane or vicinal m-plane wurtzite substrate.

9. The method of claim 1, wherein the vicinal wurtzite substrate comprises a Group III-nitride.

10. The method of claim 1, further comprising slicing a hexagonal crystal of the vicinal wurtzite substrate to create a slice offset from the principal plane of the hexagonal crystal prior to said forming the zinc-oxide based epitaxial layer on the vicinal wurtzite substrate.

11. The method of claim 1, wherein the vicinal wurtzite substrate is electrically-conductive.

12. The method of claim 1, wherein the vicinal wurtzite substrate is electrically-insulative.

13. The method of claim 1, wherein said forming the zinc-oxide based epitaxial layer on the vicinal wurtzite substrate comprises introducing a first gas including zinc and a second gas including oxygen to the vicinal wurtzite substrate.

14. A device having an epitaxial layer produced according to the method of claim 1.

15. A method of forming a zinc-oxide based epitaxial layer, the method comprising:
providing a wurtzite substrate, wherein the wurtzite substrate is a zinc-oxide based substrate and
forming a zinc-oxide based epitaxial layer on the wurtzite substrate using metalorganic chemical vapor deposition.

16. The method of claim 15, further comprising heating the wurtzite substrate to a temperature between about 400 degrees Celsius and about 900 degrees Celsius.

17. The method of claim 15, wherein the metalorganic chemical vapor deposition supersaturation ratio of Group VI elements to Group II elements is less than 8000.

18. The method of claim 15, wherein the wurtzite substrate comprises a semi-polar wurtzite substrate, and wherein the semi-polar wurtzite substrate has a deposition surface parallel or substantially parallel to a plane belonging to the {11-22} or {10-12} plane families.

19. A device having an epitaxial layer produced according to the method of claim 15.

20. A method of forming a zinc-oxide based epitaxial layer, the method comprising:
   providing a wurtzite substrate, wherein the wurtzite substrate is a zinc-oxide based substrate; and
   forming a zinc-oxide based epitaxial layer on the wurtzite substrate using metalorganic chemical vapor deposition, wherein the zinc-oxide based epitaxial layer further comprises at least one element selected from the group consisting of gold, silver, and potassium.

21. An apparatus comprising:
   a vicinal wurtzite substrate, wherein the vicinal wurtzite substrate includes an off-cut slice of a hexagonal crystal, and wherein the off-cut slice is offset from a principal crystallographic plane of the hexagonal crystal; and
   a zinc-oxide based epitaxial layer deposited on the vicinal wurtzite substrate.

22. The apparatus of claim 21, wherein the vicinal wurtzite substrate comprises an m-plane or vicinal m-plane wurtzite substrate.

23. The apparatus of claim 22, wherein the vicinal wurtzite substrate has an off-cut angle from the m-plane ranging from about 2 degrees to about 15 degrees.

24. The apparatus of claim 21, wherein the vicinal wurtzite substrate comprises a Group III-nitride.

25. The apparatus of claim 21, wherein the vicinal wurtzite substrate comprises a zinc-oxide based material.

26. The apparatus of claim 21, wherein the zinc-oxide based epitaxial layer comprises at least one element selected from the group consisting of gold, silver, and potassium.

27. An apparatus comprising:
   a semi-polar wurtzite substrate, wherein the semi-polar wurtzite substrate includes an off-cut slice of a hexagonal crystal, and wherein the off-cut slice is offset from a principal crystallographic plane of the hexagonal crystal, and wherein the semi-polar wurtzite substrate comprises at least one plane selected from the group consisting of a (10-11) plane, a (10-1-1) plane, (10-12), a (10-1-2) plane, a (11-2-1) plane, a (11-21) plane, a (11-2-2) plane, and a (11-22) plane; and
   a zinc-oxide based epitaxial layer deposited on the semi-polar wurtzite substrate.

28. The apparatus of claim 27, wherein the semi-polar wurtzite substrate comprises a deposition surface parallel or substantially parallel to a plane belonging to the {11-22} or {10-12} plane families.

* * * * *